(12) United States Patent
Seo et al.

(10) Patent No.: US 7,279,774 B2
(45) Date of Patent: Oct. 9, 2007

(54) BULK SUBSTRATES IN FINFETS WITH TRENCH INSULATION SURROUNDING FIN PAIRS HAVING FINS SEPARATED BY RECESS HOLE SHALLOWER THAN TRENCH

(75) Inventors: Hyeoung-Won Seo, Gyeonggi-do (KR); Woun-Suck Yang, Gyeonggi-do (KR); Du-Heon Song, Gyeonggi-do (KR); Jae-Man Youn, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 273 days.

(21) Appl. No.: 10/938,436

(22) Filed: Sep. 9, 2004

(65) Prior Publication Data

US 2005/0179030 A1    Aug. 18, 2005

(30) Foreign Application Priority Data

Feb. 13, 2004  (KR) ............... 10-2004-0009606

(51) Int. Cl.
*H01L 29/06* (2006.01)
*H01L 29/08* (2006.01)
*H01L 29/10* (2006.01)

(52) U.S. Cl. ..................... 257/619; 257/622
(58) Field of Classification Search ............. 257/327, 257/506, 618, 619, 622
See application file for complete search history.

(56) References Cited

U.S. PATENT DOCUMENTS 5,998,845 A * 12/1999 Ludikhuize ............. 257/401
6,413,802 B1   7/2002 Hu et al.
6,548,859 B2 * 4/2003 Maegawa ................ 257/327
6,642,090 B1 * 11/2003 Fried et al. .............. 438/164
6,750,095 B1 * 6/2004 Bertagnolli et al. ...... 438/242
6,914,277 B1 * 7/2005 Hill et al. ................ 257/213
6,963,104 B2 * 11/2005 Wu et al. ................. 257/315
6,989,308 B2 * 1/2006 Furukawa et al. ....... 438/283
2004/0110331 A1 * 6/2004 Yeo et al. ................ 438/199
2005/0035415 A1 * 2/2005 Yeo et al. ................ 257/401

FOREIGN PATENT DOCUMENTS

| JP | 63-094668 | 4/1988 |
| KR | 2001-0075236 | 8/2001 |
| KR | 2002-0018059 | 3/2002 |
| KR | 2003-0065631 | 8/2003 |

OTHER PUBLICATIONS

English language abstract of Korean Publication No. 2001-0075236, Aug. 9, 2001.
English language abstract of Japanese Publication No. 63-094668, Apr. 25, 1988.

(Continued)

*Primary Examiner*—Sara Crane
*Assistant Examiner*—Andrew O. Arena
(74) *Attorney, Agent, or Firm*—Marger Johnson & McCollom, P.C.

(57) ABSTRACT

A finFET device includes a semiconductor substrate having specific regions surrounded with a trench. The trench is filled with an insulating layer, and recess holes are formed within the specific regions such that channel fins are formed by raised portions of the semiconductor substrate on both sides of the recess holes. Gate lines are formed to overlie and extend across the channel fins. Source/drain regions are formed at both ends of the channel fins and connected by the channel fins. Other embodiments are described and claimed.

8 Claims, 11 Drawing Sheets

OTHER PUBLICATIONS

English language abstract of Korean Publication No. 2002-0018059, Mar. 7, 2002.

English language abstract of Korean Publication No. 2003-0065631, Aug. 9, 2003.

* cited by examiner

BULK SUBSTRATES IN FINFETS WITH TRENCH INSULATION SURROUNDING FIN PAIRS HAVING FINS SEPARATED BY RECESS HOLE SHALLOWER THAN TRENCH

CROSS REFERENCE TO RELATED APPLICATIONS

This application claims priority from Korean Patent Application No. 2004-9606, filed Feb. 13, 2004, the content of which is incorporated by reference in its entirety for all purposes.

BACKGROUND OF THE INVENTION

1. Field of the Invention

This disclosure relates generally to a semiconductor device and, more particularly, to a field effect transistor (FET) device having a fin-shaped channel and a method of fabricating the FET device.

2. Description of the Related Art

Along with advances in semiconductor technology, a semiconductor integrated circuit (IC) device becomes faster in operation and higher integrated. To continue performance enhancement of the device and reduction in leakage current, device design engineers have researched and developed a variety of new device structures available for sub-10 nm generations. One promising device structure is a field effect transistor device having a fin-shaped channel (finFET), such as the structure recently proposed by Chenming Hu et al. of the Regents of the University of California, USA.

This finFET device structure features a transistor channel that is formed on the vertical surfaces of an ultrathin Si fin and controlled by gate electrodes formed on both sides of the fin, and two gates that are self-aligned to each other and to the source/drain regions. Thus, this structure may also be referred to as a self-aligned double-gate finFET.

FIG. 1 is a plan diagram illustrating a conventional finFET device. FIG. 2 is a cross-sectional diagram further illustrating the conventional finFET device, and taken along the line II-II in FIG. 1.

Referring to FIGS. 1 and 2, the finFET device is fabricated on a silicon substrate 8 that is covered with an insulating layer 7. A vertically extended channel fin 3 is provided on the substrate 8 and is covered with a gate oxide layer 5. Raised source/drain regions 1 and 2 are provided at both ends of the channel fin 3 on the substrate 8. The source/drain regions 1 and 2 are connected by the channel fin 3. A gate 6 is disposed between the source/drain regions 1 and 2 and extends across the channel fin 3. Additionally, a gate spacer (not shown) may be formed on both sides of the gate 6.

Unfortunately, the conventional finFET device described above may also have some drawbacks. For example, the conventional finFET device may need complicated fabricating processes since, if a number of channels are formed, a corresponding number of source/drain regions are required. Complicated processes may increase the likelihood of errors. Furthermore, the shrinkage of pattern dimensions may require increased doping impurity concentrations. This may result in an increase of leakage current, and thereby device characteristics, such as refresh time, are degraded.

Embodiments of the invention address these and other disadvantages of the conventional art.

SUMMARY OF THE INVENTION

Some embodiments of the invention provide a finFET device that may effectively suppress leakage current. Other embodiments of the invention provide a simplified method of fabricating a finFET device that effectively suppresses leakage current.

BRIEF DESCRIPTION OF THE DRAWINGS

FIG. 3A through 10D illustrate a method of fabricating a finFET device and a resulting structure in accordance with some embodiments of the present invention.

FIG. 3A is a plan diagram illustrating an initial structure including mask blocks on a semiconductor substrate.

FIG. 4 is a cross-sectional diagram illustrating a laterally etched nitride layer of the mask block.

FIG. 5 is a cross-sectional diagram illustrating a spacer formed on sidewalls of the mask block.

FIG. 6 is a cross-sectional diagram illustrating a trench formed in the substrate.

FIG. 7 is a cross-sectional diagram illustrating the trench filled with a trench-insulating layer.

FIG. 10D is a cross-sectional diagram taken along the line XD-XD of FIG. 10A.

DETAILED DESCRIPTION OF THE INVENTION

Figure 1:
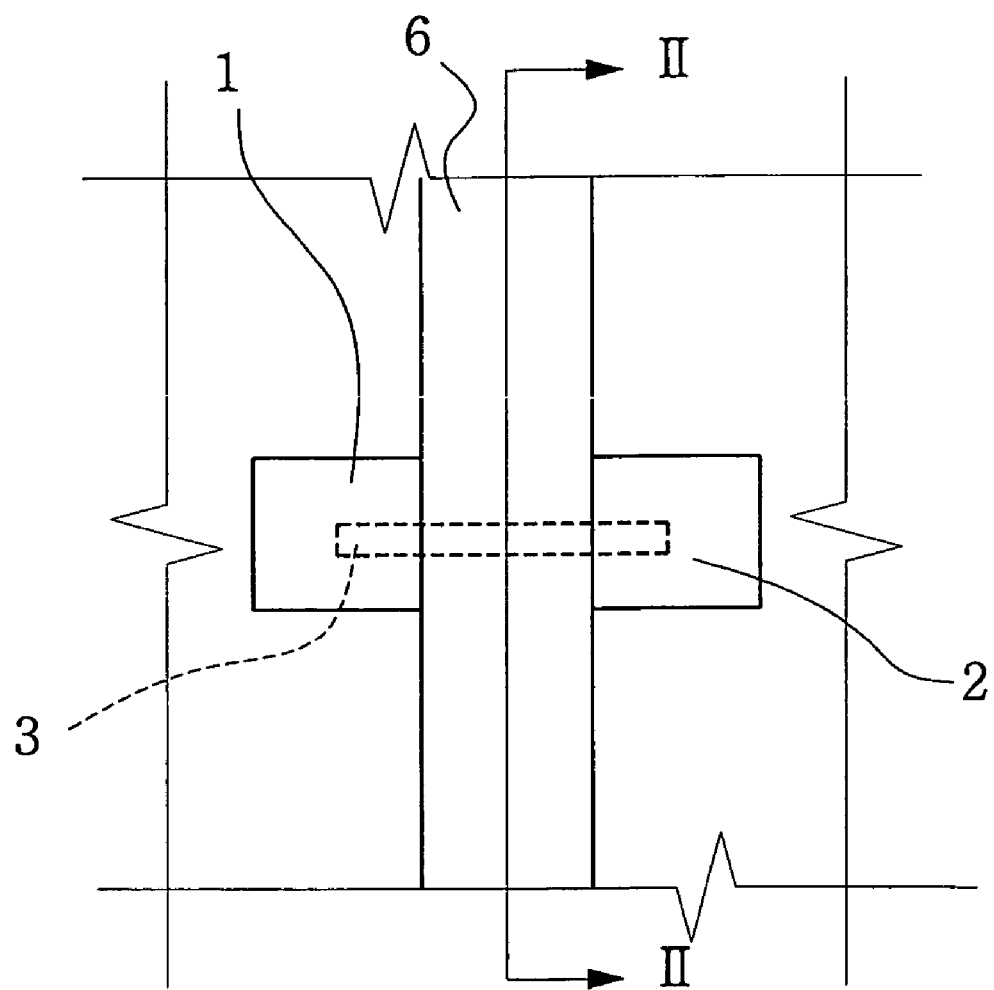
FIG. 1 is a plan diagram illustrating a conventional finFET device.
Figure 2:
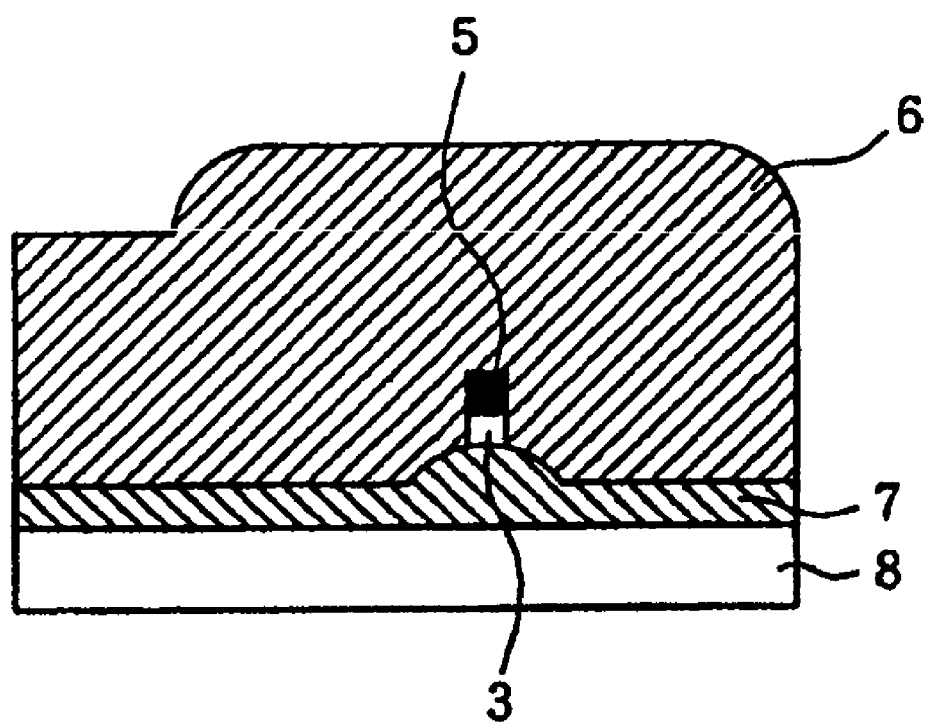
FIG. 2 is a cross-sectional diagram taken along the line II-II of FIG. 1.

Exemplary, non-limiting embodiments of the invention will now be described more fully hereinafter with reference to the accompanying drawings. This invention may, however, be embodied in many different forms and should not be construed as limited to the exemplary embodiments set forth herein. Rather, the disclosed embodiments are provided so that this disclosure will be thorough and complete, and will fully convey the scope of the invention to those skilled in the art. The principles and feature of this invention may be employed in varied and numerous embodiments without departing from the scope of the invention.

In the description, well-known structures and processes have not been described or illustrated in detail to avoid obscuring the present invention. It will be appreciated that the figures are not drawn to scale. Rather, for simplicity and clarity of illustration, the dimensions of some of the elements are exaggerated relative to other elements. Like reference numerals and characters are used for like and corresponding parts of the various drawings.

FIGS. 3A through 10D illustrate a method of fabricating a finFET device and a resulting structure in accordance with some embodiments of the invention.

Figure 3A:
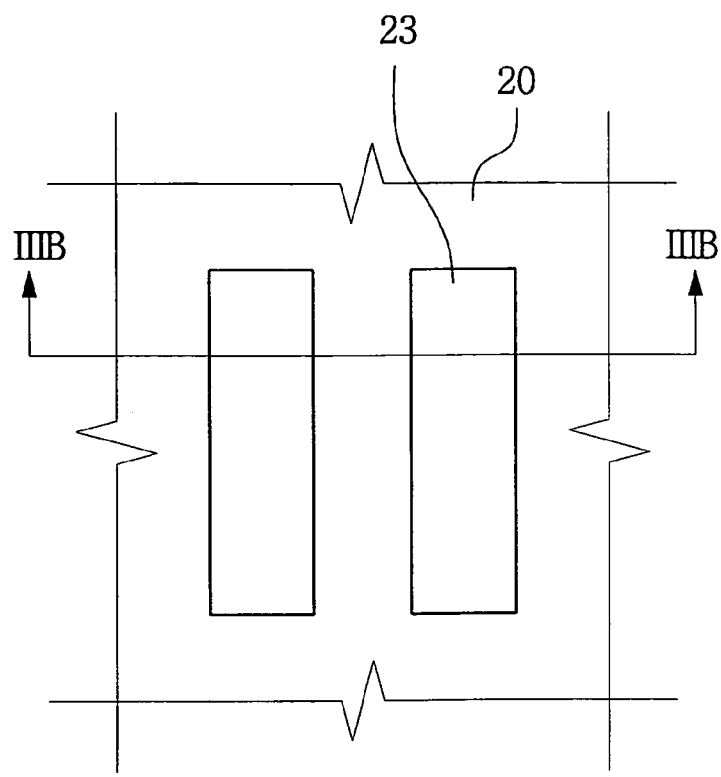
Figure 3B:
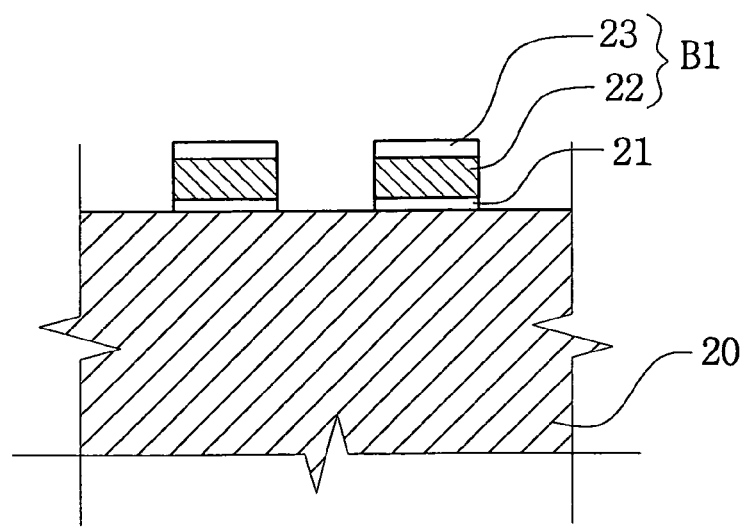
FIG. 3B is a cross-sectional diagram taken along the line IIIB-IIIB of FIG. 3A.

FIGS. 3A and 3B show an initial structure provided on a semiconductor substrate. FIG. 3A is a plan diagram illustrating an initial structure, and FIG. 3B is a cross-sectional diagram taken along the line IIIB-IIIB of FIG. 3A.

Referring to FIGS. 3A and 3B, after a semiconductor substrate 20 made of silicon, for example, is provided, a nitride layer 22 and an anti-reflection coating layer 23 are deposited in sequence and patterned on the semiconductor substrate 20. In addition, an oxide layer 21 may be interposed between the semiconductor substrate 20 and the nitride layer 22 so as to enhance adhesive strength. The anti-reflection coating layer 23 and the underlying nitride layer 22 form together a plurality of mask blocks B1, each of which has a rectangular flattened shape in a plan view and is laterally spaced apart from an adjacent mask blocks B1.

Figure 4:
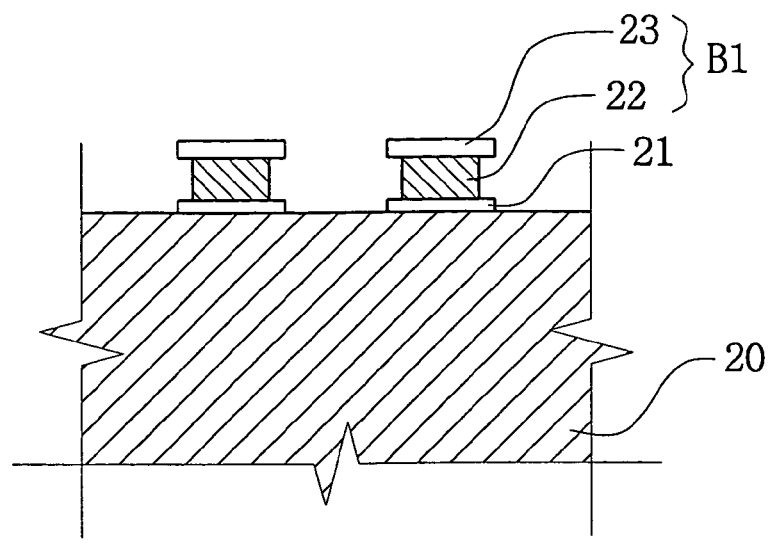

Thereafter, as shown in FIG. 4, the patterned nitride layer 22 is slightly etched in the lateral direction by using etchant such as phosphoric acid. This process effectively shrinks the width of a recess hole (H2 in FIG. 9B) as will be described later. The narrower recess hole will make it possible to reduce the distance between adjacent channel fins, thus allowing much smaller dimensions of circuit patterns.

Figure 5:
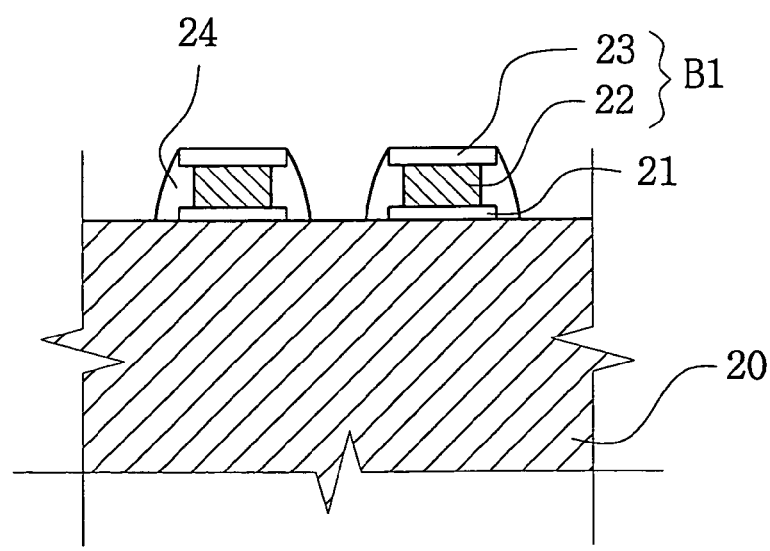

Next, a resultant structure is completely coated with suitable insulating material, which is then subjected to an etch-back process. So, as shown in FIG. 5, a spacer 24 is formed on sidewalls of each mask block B1.

Figure 6:
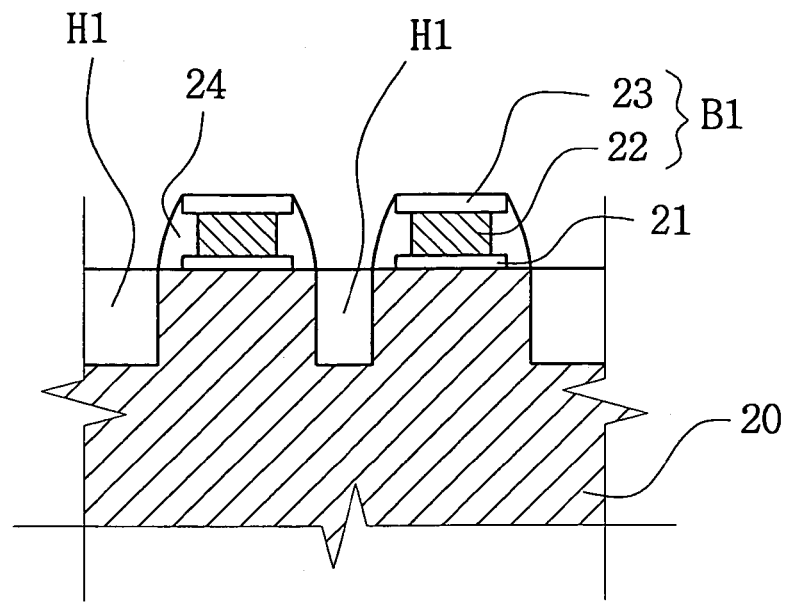

As shown in FIG. 6, an exposed region of the semiconductor substrate 20 is then partially etched using both the mask block B1 and the spacer 24 as an etch mask, so that a trench H1 is formed in the exposed region of the substrate 20. As seen in FIG. 6, the trench H1 may have a cross-sectional profile of a rectangle. However, the trench H1 may alternatively have other cross-sectional profiles such as a reverse triangle (i.e., overturned triangle), a reverse trapezoid, or other geometric shapes.

Figure 7:
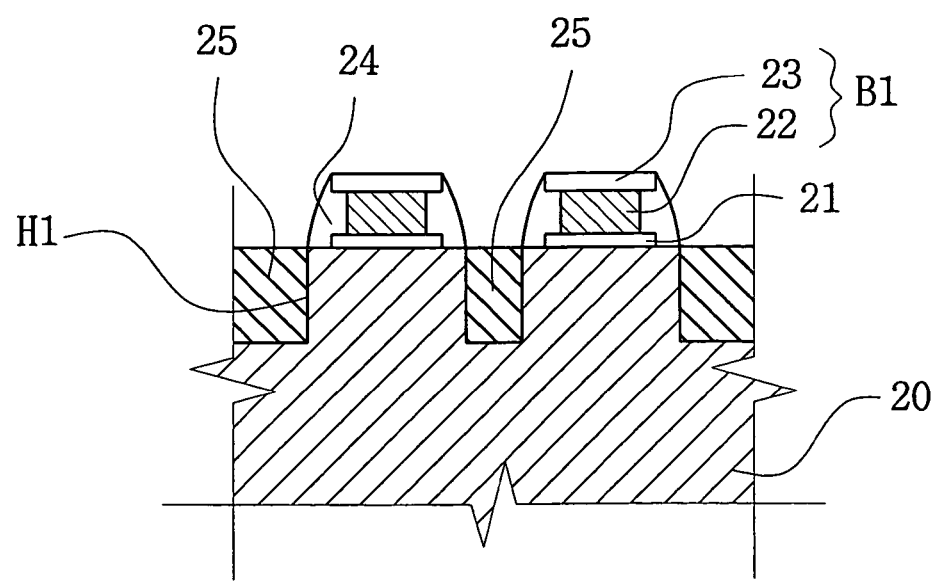

Next, as shown in FIG. 7, the trench H1 is filled with insulating material such as oxide, so that a trench-insulating layer 25 is produced in the trench H1. Shallow trench isolation (STI) techniques that are well known in this art may be used to form and fill the trench H1.

Figure 8A:
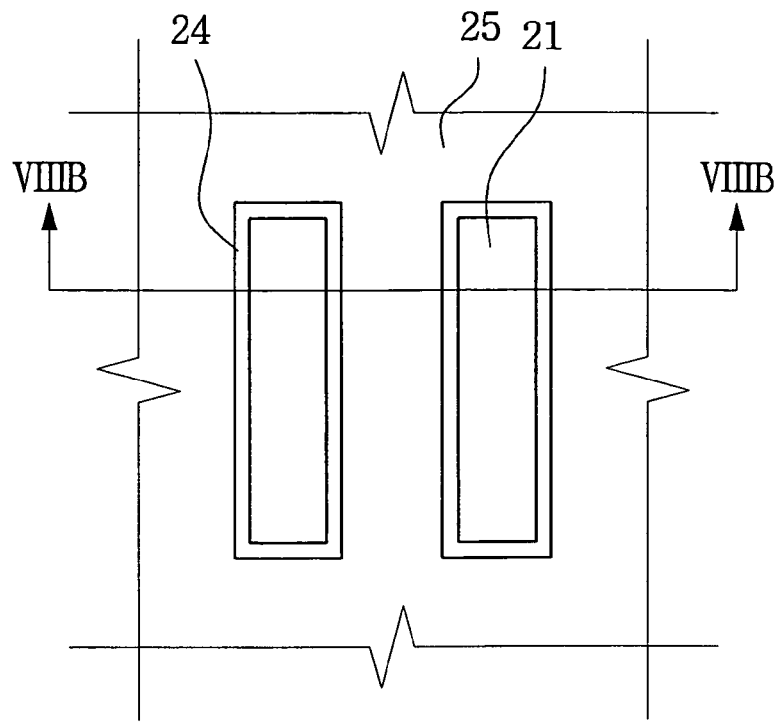
FIG. 8A is a plan diagram illustrating a structure from which the mask blocks are removed.
Figure 8B:
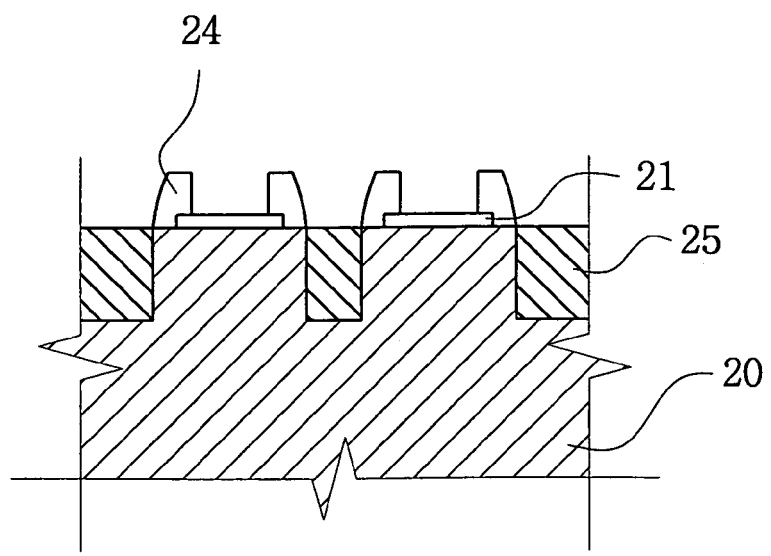
FIG. 8B is a cross-sectional diagram taken along the line VIIIB-VIIIB of FIG. 8A.

After the trench-insulating layer 25 is formed, the mask blocks B1 composed of the anti-reflective coating layer 23 and the nitride layer 22 are completely removed. As shown in FIGS. 8A and 8B, however, the spacer 24 and the oxide layer 21 still remain on the substrate 20. This removal step may include removing upper parts of the spacer 24 as well as the anti-reflective coating layer 23 by a chemical mechanical polishing (CMP) process, and further, removing the nitride layer 22 by using etchant such as phosphoric acid. FIG. 8A is a plan diagram illustrating a resultant structure on the substrate 20, and FIG. 8B is a cross-sectional diagram taken along the line VIIIB-VIIIB of FIG. 8A.

Figure 9A:
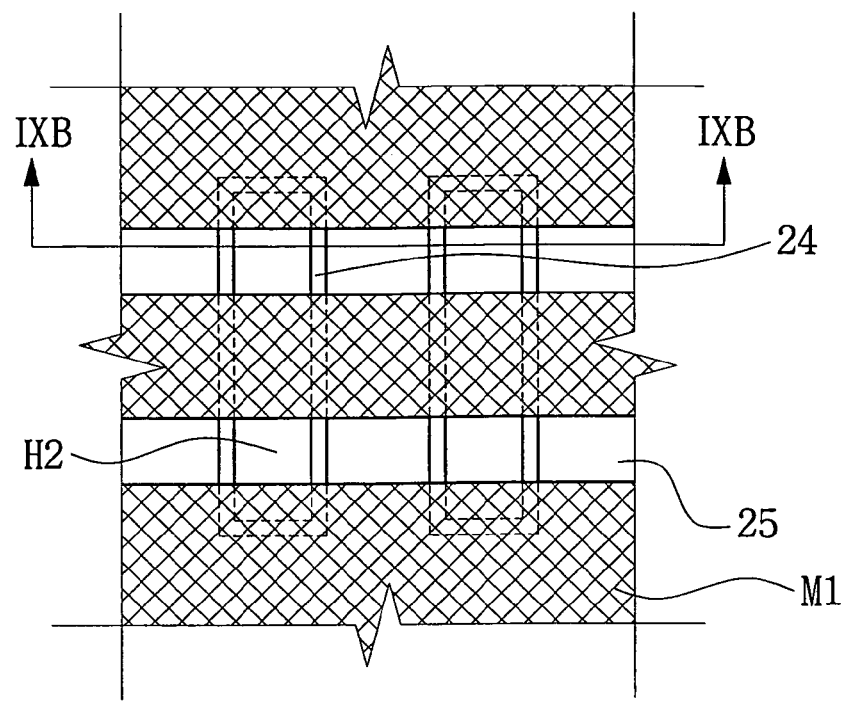
FIG. 9A is a plan diagram illustrating a mask layer provided on a structure of FIG. 8A.
Figure 9B:
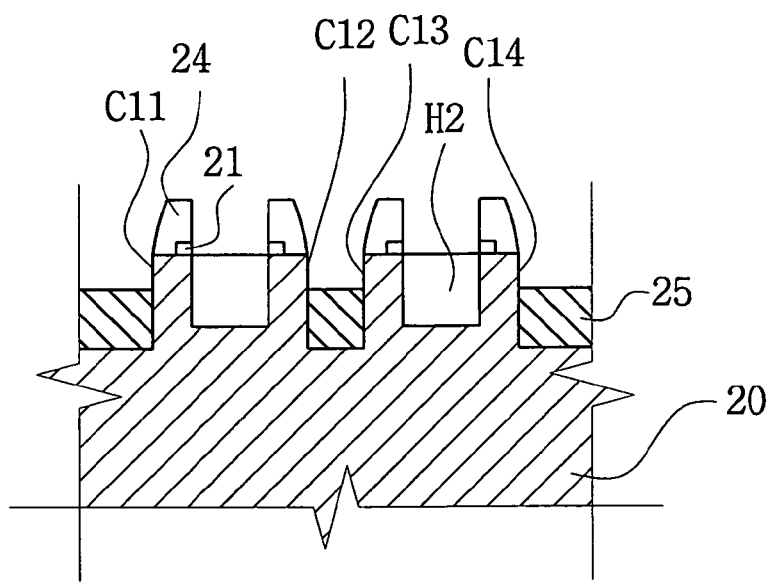
FIG. 9B is a cross-sectional diagram taken along the line IXB-IXB of FIG. 9A.

Additionally, FIG. 9A is a plan diagram illustrating a mask layer provided on the above resultant structure in FIG. 8A, and FIG. 9B is a cross-sectional diagram taken along the line IXB-IXB of FIG. 9A.

Referring to FIGS. 9A and 9B, the mask layer M1 is deposited over the structure and then patterned. Patterned lines of the mask layer M1 are spaced apart from each other and are extended across the rectangular patterns of the oxide layer 21. That is, the patterned lines of the mask layer M1 cross over the remaining spacers 24. Therefore, the spacers 24 and the oxide layer 21 are partly exposed between the patterned lines of the mask layer M1. While the mask layer M1 and exposed portions of the spacers 24 are used together as an etch mask, the structure is subjected to an etch process. Therefore, exposed portions of the oxide layer 21 are removed, and further, underlying portions of the substrate 20 are partially removed, thus forming recess holes H2. Silicon recess techniques well known in this art may be used to form the recess holes H2. By etching, the trench-insulating layer 25 is also partially removed.

Thereafter, the mask layer M1, the spacers 24, and the oxide layer 21 are all removed, thus leaving raised portions C11, C12, C13, and C14 of the substrate 20. Each raised portion C11 through C14 may form channel fins, a pair of channel fins being located on the sides of each recess hole H2. Furthermore, each channel fin is located between the trench-insulating layer 25 and the recess hole H2.

Figure 10A:
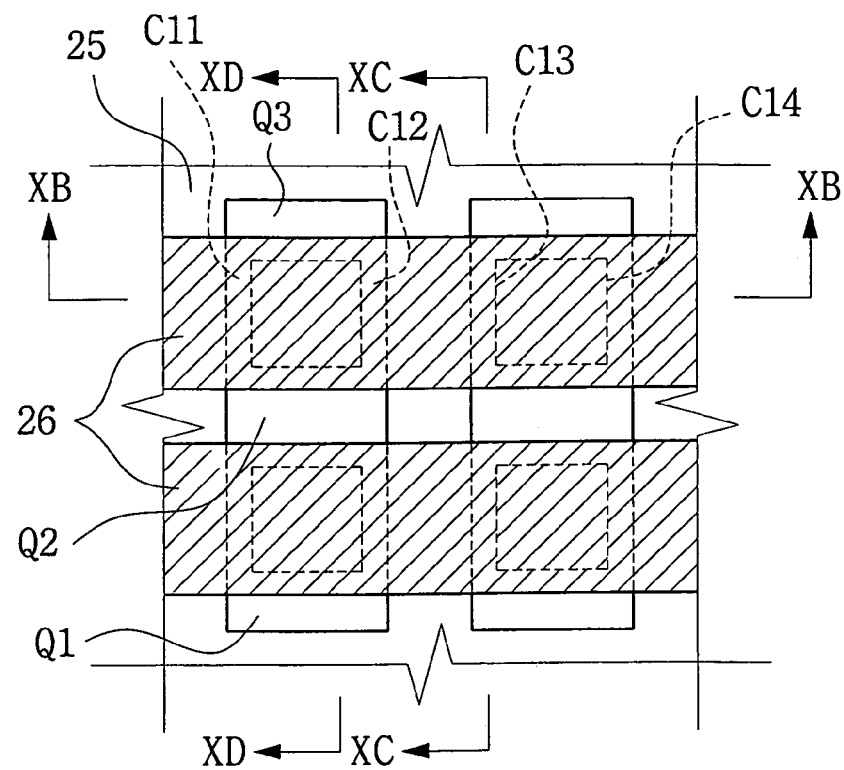
FIG. 10A is a plan diagram illustrating gate lines provided on a prior structure of FIG. 9A.
Figure 10B:
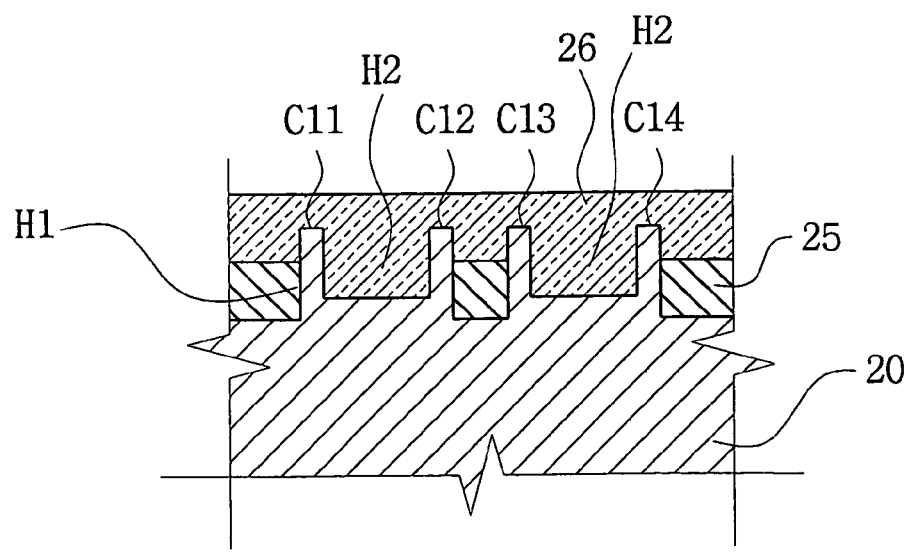
FIG. 10B is a cross-sectional diagram taken along the line XB-XB of FIG. 10A.
Figure 10C:
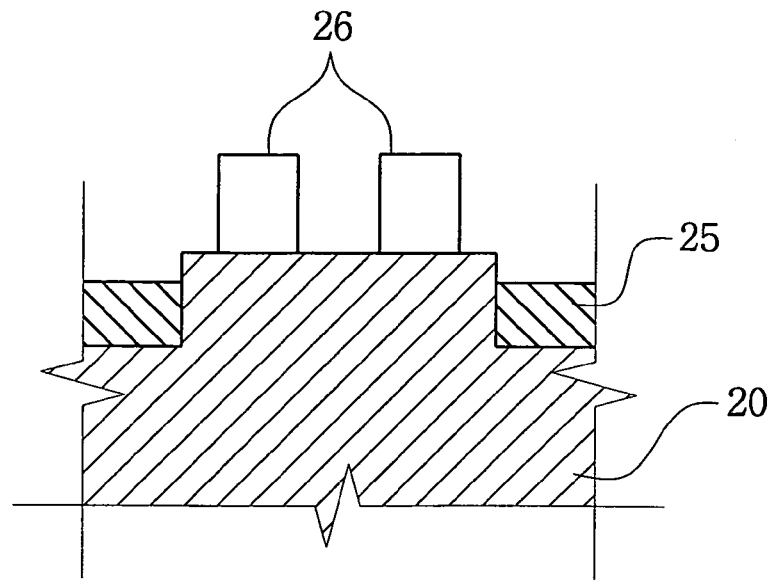
FIG. 10C is a cross-sectional diagram taken along the line XC-XC of FIG. 10A.
Figure 10D:
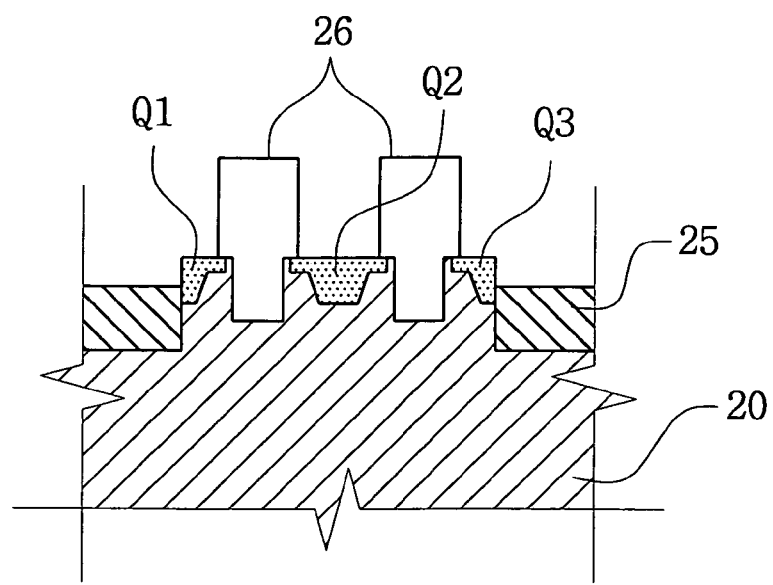

Next, as shown in FIGS. 10A through 10D, gate lines 26 are provided over a structure which was shown above in FIGS. 9A and 9B, covering the channel fins C11-C14. FIG. 10A is a plan diagram illustrating the gate lines 26 on the structure, and FIG. 10B is cross-sectional diagram taken along the line XB-XB of FIG. 10A. Additionally, FIG. 10C is a cross-sectional diagram taken along the line XC-XC of FIG. 10A, and FIG. 10D is a cross-sectional diagram taken along the line XD-XD of FIG. 10A.

The gate lines 26 extend across the channel fins C11-C14, as is best shown in FIG. 10A. Each gate line 26 includes a gate dielectric layer, a gate electrode, and a stopper layer, which are stacked in sequence on the substrate 20 but for clarity are not illustrated separately. The gate electrode may be formed of conductive material such as copper, whereas the gate dielectric layer and the stopper layer may be formed of an insulating material such as oxide.

After the gate lines 26 are formed, source/drain regions Q1 through Q3 are formed at both ends of the channel fins C11-C14 by doping an impurity, adjoining both sides of the gate lines 26, as is best shown in FIGS. 10B and 10D. So the source/drain regions Q1-Q3 are connected by the channel fins C11-C14. Instead of the profile illustrated in FIG. 10D, the source/drain regions Q1-Q3 may alternatively have other profiles such as a shallow rectangle, for example.

Thereafter, a suitable insulating layer, a metal contact, a metal line, and so on are provided in sequence on the above structure. These processes are well known in this art, and therefore a detailed discussion is omitted.

As seen from FIGS. 10A-10D, a resulting structure of the finFET device according to these embodiments includes the semiconductor substrate 20, the trench-insulating layer 25, the gate lines 26, and the source/drain regions Q1-Q3. The substrate 20 has the trench (H1 in FIG. 6) that defines specific regions surrounded therewith and is filled with the trench-insulating layer 25. The channel fins C11-14 are formed along both sides of the specific regions of the substrate 20. The gate lines 26 overlay and extend across the channel fins C11-C14. The source/drain regions Q1-Q3 are formed at both ends of the channel fins C11-C14 and also connected by the channel fins C11-C14.

As discussed, the channel fins C11-C14 are formed in the semiconductor substrate 20 having the trench structure, and further, the trench structure can be provided using existing processes. Therefore, the embodiments provide a relatively simple fabrication process, and therefore the likelihood of process errors is reduced.

The finFET device according to the embodiments described above has a dual fin structure wherein the respective one in the pair of channel fins C11-C14 is separated from the other in the pair by the gate dielectric layer provided in the recess hole H2. Additionally, the pairs of channel fins C11-C12, C13-C14 connects together the source/drain regions Q1-Q3. To more effectively suppress unwanted leakage current between the adjacent channels, the bottom of the recess hole H2 is positioned between the top and bottom of the trench-insulating layer 25.

Figure 11:
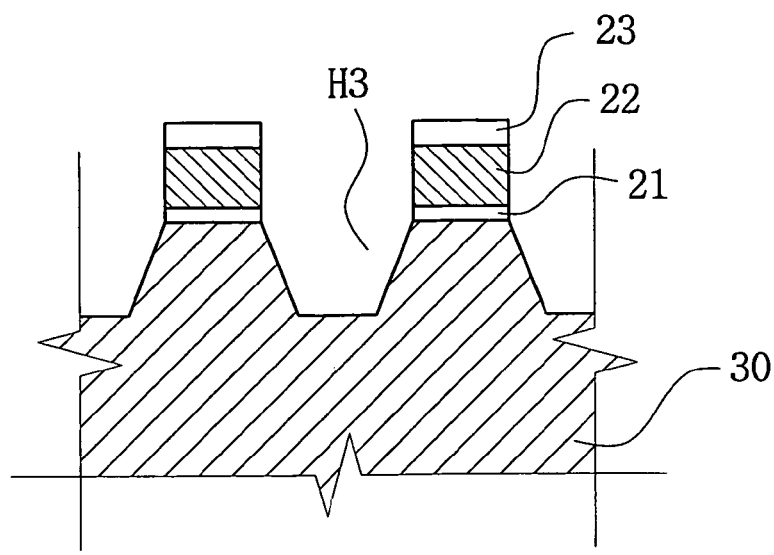
FIGS. 11 through 13 illustrate a method of fabricating a finFET device and a resulting structure in accordance with some other embodiments of the invention.
Figure 12:
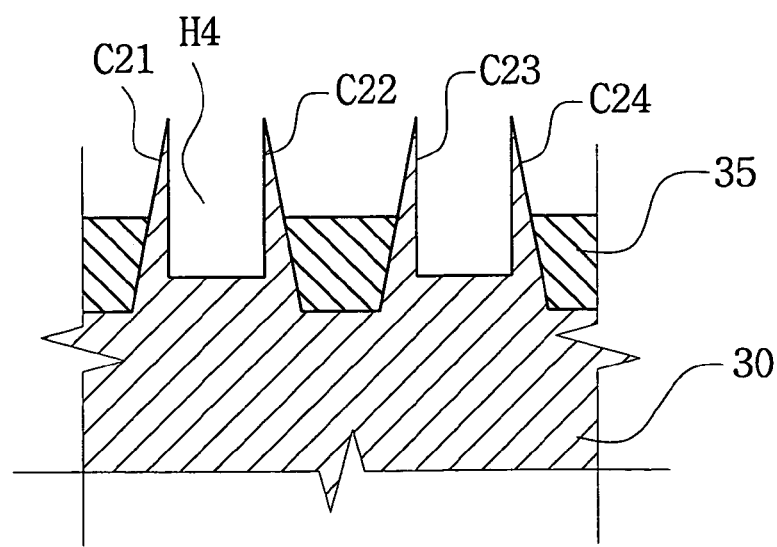
Figure 13:
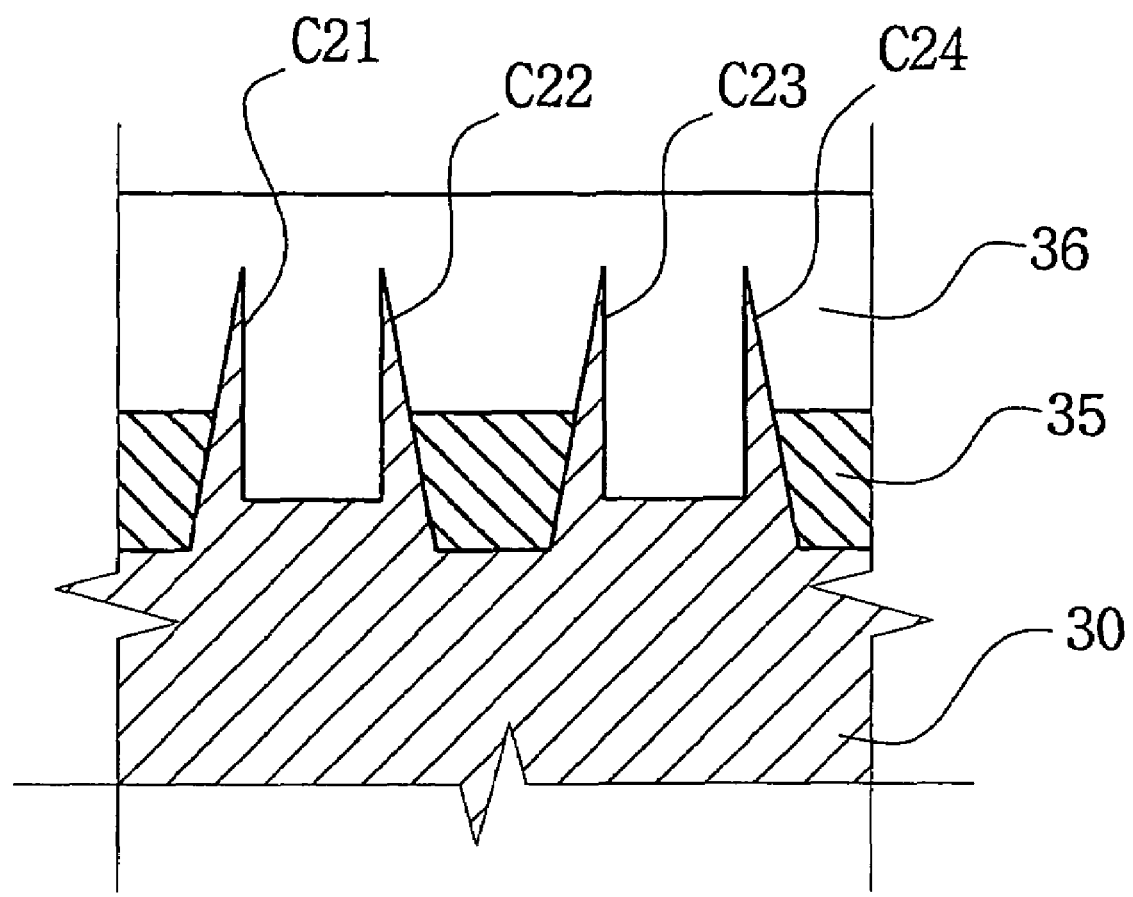

FIGS. 11 through 13 illustrate a method of fabricating a finFET device and a resulting structure in accordance with other embodiments of the invention.

Referring to FIG. 11, an oxide layer 21, a nitride layer 22, and an anti-reflection coating layer 23 are deposited in sequence and patterned on a semiconductor substrate 30. While the patterned layers 21, 22 and 23 are used as an etch mask, an exposed region of the semiconductor substrate 30 is partially etched. Thus a trench H3 is formed in the exposed region of the substrate 30.

Next, as shown in FIG. 12, the trench H3 is filled with insulating material such as oxide, so a trench-insulating layer 35 is produced in the trench H3. The patterned layers 21, 22, and 23 are then removed, and a suitable fin mask pattern (not shown) is provided on the substrate 30. With the fin mask pattern used, exposed portions of the substrate 30 are recessed by etching to form recess holes H4. By etching, the trench-insulating layer 35 is also partially removed.

Next, the fin mask pattern is removed, leaving raised portions C21, C22, C23, and C24 on the substrate 30. The raised portions C21-C24 form channel fins, a pair of which is located along the sides of each recess hole H4. As illustrated in FIG. 12, the channel fins C21-C24 may have a cross-sectional profile shaped like a pointed triangle. Alternatively, the channel fins C21-24 may have other cross-sectional profiles, for example, profiles that are shaped like a rectangle, a trapezoid, or some other geometric shape.

Next, as shown in FIG. 13, gate lines 36 are provided over a resulting structure in FIG. 12, covering the channel fins C21-C24. Subsequent processes are the same as those discussed above with respect to the embodiments illustrated in FIGS. 3-10, and therefore a detailed discussion is omitted.

The invention may be practiced in many ways. Exemplary, non-limiting descriptions of some embodiments of the invention are described in the following paragraphs.

According to some embodiments of the invention, a finFET device includes a semiconductor substrate having a trench formed therein to define a specific region surrounded with the trench; a trench-insulating layer filling the trench; at least one channel fin formed in the specific region; gate lines overlying and extending across the channel fin; and source/drain regions formed at both ends of the channel fin and connected by the channel fin.

According to other embodiments of the invention, a method of fabricating a finFET device includes providing a semiconductor substrate having a specific region; forming a trench in the semiconductor substrate by etching such that the specific region is surrounded with the trench; forming a trench-insulating layer filling the trench; forming recess holes within the specific region such that channel fins are formed by raised portions of the semiconductor substrate on both sides of the recess holes; forming gate lines overlying and extending across the channel fins; and forming source/drain regions at both ends of the channel fins.

According to still other embodiments of the invention, a method of fabricating a finFET device includes providing a semiconductor substrate having a specific region; forming mask blocks on the semiconductor substrate such that the mask blocks cover the specific region; forming a spacer on sidewalls of the mask blocks; forming a trench in the semiconductor substrate by etching with the mask blocks used as an etch mask; forming a trench-insulating layer filling the trench; removing the mask blocks from the semiconductor substrate; forming mask lines on the semiconductor substrate such that the mask lines cross over the spacer; forming recess holes within the specific region by etching the semiconductor substrate with both the mask lines and the spacer used as an etch mask such that channel fins are formed by raised portions of the semiconductor substrate on both sides of the recess holes; removing both the mask lines and the spacer such that the channel fins are exposed; forming gate lines overlying and extending across the channel fins; and forming source/drain regions at both ends of the channel fins.

While this invention has been particularly shown and described with reference to exemplary embodiments thereof, it will be understood by those skilled in the art that various changes in form and details may be made therein without departing from the spirit and scope of the invention as defined by the appended claims.

We claim:

1. A field effect transistor (FET) device having a channel fin structure, comprising:
    a semiconductor substrate having a trench formed therein to define a specific region surrounded by the trench;
    a trench-insulating layer filling the trench;
    a pair of channel fins formed in the specific region, each of the pair spaced apart by a recess hole having a bottom that is at a height above a bottom of the trench;
    gate lines overlying and extending across the at least one channel fin; and
    source/drain regions formed at both ends of the at least one channel fin and connected by the at least one channel fin.

2. The FET device of claim 1, wherein the bottom of the recess hole is positioned below a top and above a bottom of the trench-insulating layer.

3. The FET device of claim 1, wherein the recess hole is filled by one of the gate lines.

4. The FET device of claim 3, wherein the recess hole does not include the trench-insulating layer.

5. The FET device of claim 1, wherein the trench has a cross-sectional profile shaped like a reverse triangle or a reverse trapezoid.

6. The FET device of claim 1, wherein the height of the trench-insulating layer is smaller than the depth of the trench.

7. The FET device of claim 1, wherein at least one of the channel fins has a cross-sectional profile shaped like a pointed triangle or a trapezoid.

8. The FET device of claim 1, wherein a bottom of the source/drain regions is positioned between a top and a bottom of the trench-insulating layer.

* * * * *

UNITED STATES PATENT AND TRADEMARK OFFICE
CERTIFICATE OF CORRECTION

PATENT NO. : 7,279,774 B2
APPLICATION NO. : 10/938436
DATED : October 9, 2007
INVENTOR(S) : Hyeoung-Won Seo et al.

It is certified that error appears in the above-identified patent and that said Letters Patent is hereby corrected as shown below:

Title page, item [75] Inventor name "Jae-Man Youn" should read -- Jae-Man Yoon --.

Signed and Sealed this

Sixteenth Day of September, 2008

JON W. DUDAS
*Director of the United States Patent and Trademark Office*